United States Patent
Ohnuma et al.

(10) Patent No.: US 7,625,785 B2
(45) Date of Patent: Dec. 1, 2009

(54) SEMICONDUCTOR DEVICE AND MANUFACTURING METHOD THEREOF

(75) Inventors: Hideto Ohnuma, Kanagawa (JP); Masayuki Sakakura, Kanagawa (JP); Yasuhiro Mitani, Osaka (JP); Takuya Matsuo, Osaka (JP); Hidehito Kitakado, Nara (JP)

(73) Assignees: Semiconductor Energy Laboratory Co., Ltd., Kanagawa-Ken (JP); Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/896,155

(22) Filed: Aug. 30, 2007

(65) Prior Publication Data
US 2008/0003729 A1 Jan. 3, 2008

Related U.S. Application Data

(62) Division of application No. 11/012,171, filed on Dec. 16, 2004, now Pat. No. 7,276,402.

(30) Foreign Application Priority Data
Dec. 25, 2003 (JP) ............................. 2003-429552

(51) Int. Cl.
*H01L 21/84* (2006.01)
(52) U.S. Cl. ...................... 438/151; 438/160; 438/723; 257/E21.413; 257/E27.111
(58) Field of Classification Search ............... 438/150, 438/160, 710, 723
See application file for complete search history.

(56) References Cited

U.S. PATENT DOCUMENTS

| | | | |
|---|---|---|---|
| 4,886,765 A | 12/1989 | Chen et al. | |
| 5,514,610 A | 5/1996 | Wann et al. | |
| 5,543,352 A | 8/1996 | Ohtani et al. | |

(Continued)

FOREIGN PATENT DOCUMENTS

CN        1131342 A        9/1996

(Continued)

OTHER PUBLICATIONS

Patent Office of the People's Republic of China—First Office Action—Patent Appln. No. 200410095406 Dec. 24, 2004 "Semiconductor Device and Manufacturing Method Thereof" Dated: Sep. 7, 2007.

(Continued)

*Primary Examiner*—Alexander G Ghyka
(74) *Attorney, Agent, or Firm*—Nixon Peabody LLP; Jeffrey L. Costellia (57) ABSTRACT

A semiconductor device having a crystalline semiconductor film with production of a cavity suppressed and a manufacturing method thereof A manufacturing method of a semiconductor device according to the invention comprises the steps of forming an amorphous silicon film on a substrate having an insulating surface, adding a metal element such as Ni for promoting crystallization to the amorphous silicon film, applying heat treatment to crystallize the amorphous silicon film, so that a crystalline silicon film is formed on the substrate, removing a silicon oxide film formed on the surface of the crystalline silicon film due to the heat treatment by a solution containing organic solvent and fluoride, and irradiating laser light or strong light to the crystalline silicon film.

4 Claims, 7 Drawing Sheets

U.S. PATENT DOCUMENTS

| | | |
|---|---|---|
| 5,789,284 A | 8/1998 | Yamazaki et al. |
| 5,849,643 A | 12/1998 | Gilmer et al. |
| 5,879,977 A | 3/1999 | Zhang et al. |
| 6,015,724 A | 1/2000 | Yamazaki |
| 6,027,960 A * | 2/2000 | Kusumoto et al. .......... 438/166 |
| 6,071,766 A | 6/2000 | Yamazaki et al. |
| 6,117,796 A | 9/2000 | Gale et al. |
| 6,180,439 B1 | 1/2001 | Yamazaki et al. |
| 6,331,457 B1 | 12/2001 | Yamazaki et al. |
| 6,337,229 B1 | 1/2002 | Yamazaki et al. |
| 6,337,235 B1 | 1/2002 | Miyanaga et al. |
| 6,355,509 B1 | 3/2002 | Yamazaki |
| 6,368,904 B1 | 4/2002 | Yamazaki |
| 6,380,007 B1 | 4/2002 | Koyama |
| 6,383,852 B2 | 5/2002 | Zhang et al. |
| 6,399,454 B1 | 6/2002 | Yamazaki |
| 6,426,276 B1 | 7/2002 | Ohnuma et al. |
| 6,432,756 B1 | 8/2002 | Ohtani et al. |
| 6,433,363 B1 | 8/2002 | Yamazaki et al. |
| 6,451,638 B1 | 9/2002 | Zhang et al. |
| 6,461,943 B1 | 10/2002 | Yamazaki et al. |
| 6,489,189 B2 | 12/2002 | Yamazaki et al. |
| 6,544,826 B1 | 4/2003 | Yamazaki et al. |
| 6,620,711 B2 | 9/2003 | Yamazaki |
| 6,624,049 B1 | 9/2003 | Yamazaki |
| RE38,266 E | 10/2003 | Yamazaki et al. |
| 6,664,144 B2 | 12/2003 | Nakajima et al. |
| 6,670,225 B2 | 12/2003 | Ohnuma |
| 6,713,323 B2 | 3/2004 | Yamazaki et al. |
| 6,727,124 B2 | 4/2004 | Nakajima et al. |
| 6,743,700 B2 | 6/2004 | Asami et al. |
| 6,756,608 B2 | 6/2004 | Kasahara et al. |
| 2001/0036692 A1 | 11/2001 | Yamazaki et al. |
| 2001/0038090 A1 | 11/2001 | Rasmussen et al. |
| 2003/0022513 A1 | 1/2003 | Wu et al. |
| 2003/0129848 A1 | 7/2003 | Choi |
| 2006/0134891 A1 | 6/2006 | Ohnuma et al. |
| 2006/0183276 A1 | 8/2006 | Yamazaki et al. |

FOREIGN PATENT DOCUMENTS

| | | |
|---|---|---|
| CN | 1405855 A | 3/2003 |
| JP | 08-213316 | 8/1996 |
| WO | WO 02/19409 A2 | 3/2002 |
| WO | WO 02/086045 A1 | 10/2002 |

OTHER PUBLICATIONS

Patent Office of the People's Republic of China—First Office Action—Patent Appln. No. 200410104859.3, Dec. 24, 2004, "Method for Manufacturing Semiconductor Device," Dated: Oct. 12, 2007.

* cited by examiner

| Etchant | Immersion Period | Observation Number | Cavity Number | Cavity Density (psc/$\mu m^2$) |
|---|---|---|---|---|
| 0.5%HF | 11 minutes 40 seconds | 8 | 10 | $3.3 \times 10^{-3}$ |
| BHF added surfactant | 5 minutes | 10 | 0 | 0 ($<2.7 \times 10^{-4}$) |
| IPA+$H_2O$+HF | 10 minutes | 13 | 0 | 0 ($<2.1 \times 10^{-4}$) |

SEMICONDUCTOR DEVICE AND MANUFACTURING METHOD THEREOF

This application is a Divisional of application Ser. no. 11/012,171 filed Dec. 16, 2004, now U.S. Pat. No. 7,276,402.

BACKGROUND OF THE INVENTION

1. Field of the Invention

The present invention relates to a semiconductor device and a manufacturing method thereof, and in particular, relates to a semiconductor device in which a cavity (a hole, an opening, a pore, and the like) is prevented from being produced at a crystalline semiconductor film and a manufacturing method thereof.

2. Description of the Related Art

When an amorphous silicon film is added with a metal such as Ni and heat treatment is applied thereto, a crystalline silicon film can be formed at low temperature in short time. Subsequently, a natural oxide film that is formed incidentally on the crystalline silicon film due to the heat treatment is removed by using diluted hydrofluoric acid. As the crystalline silicon film at this stage has many crystal defects, electromagnetic energy is supplied to the crystalline silicon film in the subsequent step. Consequently, a high-quality crystalline silicon film with few crystal defects can be obtained. Laser light such as excimer laser light typifies the electromagnetic energy as a specific example. A crystalline silicon film manufactured by this method can be used for manufacturing an electronic device such as a high-performance thin film transistor (TFT).

SUMMARY OF THE INVENTION

FIG. 6 shows photographs of the surface of a crystalline silicon film formed with the above-mentioned method, which are taken by an electron microscope. It is seen from the photographs that cavities are produced in the crystalline silicon film. The reason of production of the cavity is supposed to be as the following. The cavity may cause some defect.

In the above-mentioned method of forming a crystalline silicon film, nickel silicide may be separated out in a crystalline silicon film when the heat treatment is applied after adding Ni. Therefore, in removing a natural oxide film on the surface of the crystalline silicon film by diluted hydrofluoric acid, the nickel silicide in the crystalline silicon film is etched. A cavity may be, accordingly, formed in a crystalline silicon film. This cavity may remain even after irradiation of excimer laser light that is electromagnetic energy, and such crystalline silicon film having a cavity causes a defect of a withstand voltage in the case of forming a TFT or a capacitor in many cases.

The invention is made in view of the aforementioned circumstance, and an object of the invention is to provide a semiconductor device in which production of a cavity in a crystalline semiconductor film is suppressed and a manufacturing method thereof.

In order to solve the aforementioned problems, a manufacturing method of a semiconductor device according to the invention comprises the steps of forming an amorphous film containing silicon over a substrate having an insulating surface, adding a metal element for promoting crystallization of the amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by a solution containing organic solvent and fluoride.

According to the above-described manufacturing method of a semiconductor device, a silicon oxide film is formed on the surface of a crystalline semiconductor film when forming the crystalline semiconductor film by the heat treatment, and this silicon oxide film is removed from the surface of the crystalline semiconductor film by a solution containing organic solvent and fluoride. Employing such solution containing organic solvent and fluoride contributes to suppress production of a deep cavity in a crystalline semiconductor film. Note that, the deep cavity means a cavity whose bottom portion reaches a base insulating film.

In addition, in a manufacturing method of a semiconductor device according to the invention, after removal of the silicon oxide film by the solution, laser light or strong light is preferably irradiated to the crystalline semiconductor film. It enables not only to reduce crystal defects of the crystalline semiconductor film, but also to eliminate a shallow cavity.

In a manufacturing method of a semiconductor device according to the invention, the organic solvent is preferably any one of isopropyl alcohol, ethanol, denatured alcohol, and ethylene glycol.

A manufacturing method of a semiconductor device according to the invention comprises the steps of forming an amorphous film containing silicon on a substrate having an insulating surface, adding a metal element for promoting crystallization of the amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by a solution containing surfactant and fluoride.

According to the above-described manufacturing method of a semiconductor device, since a solution containing surfactant and fluoride is employed, production of a deep cavity in a crystalline semiconductor film can be suppressed.

In addition, in a manufacturing method of a semiconductor device according to the invention, after removal of the silicon oxide film by the solution, laser light or strong light is preferably irradiated to the crystalline semiconductor film. It enables not only to reduce crystal defects of the crystalline semiconductor film, but also to eliminate a shallow cavity.

In a manufacturing method of a semiconductor device according to the invention, the surfactant preferably contains at least one of alkyl sulfonic acid, ω-hydrofluoro-alkyl-carboxylic acid, aliphatic carboxylic acid, aliphatic amine, aliphatic alcohol, and aliphatic carboxylic acid chloride.

A manufacturing method of a semiconductor device according to the invention comprises the steps of forming an amorphous film containing silicon over a substrate having an insulating surface, adding a metal element for promoting crystallization of the amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by dry etching.

According to the above-described manufacturing method of a semiconductor device, since dry etching is employed, production of a cavity in a crystalline semiconductor film can be suppressed.

In addition, in a manufacturing method of a semiconductor device according to the invention, after removal of the silicon oxide film by the dry etching, laser light or strong light is preferably irradiated to the crystalline semiconductor film.

A manufacturing method of a semiconductor device according to the invention comprises the steps of forming an amorphous film containing silicon over a substrate having an insulating surface, adding a metal element for promoting crystallization of the amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by plasma treatment using a plasma gas containing $CHF_3$.

According to the above-described manufacturing method of a semiconductor device, since plasma treatment using a plasma gas containing $CHF_3$ is employed, production of a cavity in a crystalline semiconductor film can be suppressed.

A manufacturing method of a semiconductor device according to the invention comprises the steps of forming an amorphous film containing silicon over a substrate having an insulating surface, adding a metal element for promoting crystallization of the amorphous film over the amorphous film, applying heat treatment to the amorphous film to crystallize the amorphous film, thereby forming a crystalline semiconductor film over the substrate, removing a silicon oxide film which is formed on the surface of the crystalline semiconductor film due to the heat treatment by plasma treatment using a plasma gas containing $CHF_3$, and removing $CF_x$ which is deposited on the crystalline semiconductor film in removal of the silicon oxide film by the plasma treatment by plasma treatment using a plasma gas containing at least one of Ar, $H_2$ and $NH_3$.

According to the above-described manufacturing method of a semiconductor device, since plasma treatment using a plasma gas containing $CHF_3$ and plasma treatment using a plasma gas containing at least one of Ar, $H_2$ and $NH_3$ are employed, production of a cavity in a crystalline semiconductor film can be suppressed.

In addition, in a manufacturing method of a semiconductor device according to the invention, after removal of the $CF_x$ by the plasma treatment using a plasma gas containing at least one of Ar, $H_2$ and $NH_3$, laser light or strong light is preferably irradiated to the crystalline semiconductor film.

A manufacturing method of a semiconductor device according to the invention comprises the steps of forming an amorphous film containing silicon over a substrate having an insulating surface, adding a metal element for promoting crystallization of the amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by plasma treatment using a plasma gas containing at least one of Ar, $H_2$ and $NH_3$, and $CHF_3$.

According to the above-described manufacturing method of a semiconductor device, since plasma treatment using a plasma gas containing at least one of Ar, $H_2$ and $NH_3$, and $CHF_3$ is employed, production of a cavity in a crystalline semiconductor film can be suppressed.

A manufacturing method of a semiconductor device according to the invention comprises the steps of forming an amorphous film containing silicon over a substrate having an insulating surface, adding a metal element for promoting crystallization of an amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by plasma treatment using a plasma gas containing $NF_3$.

According to the above-described manufacturing method of a semiconductor device, since plasma treatment using a plasma gas containing $NF_3$ is employed, production of a cavity in a crystalline semiconductor film can be suppressed.

A manufacturing method of a semiconductor device according to the invention comprises the steps of forming an amorphous film containing silicon over a substrate having an insulating surface, adding a metal element for promoting crystallization of an amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by plasma treatment using a plasma gas containing $NF_3$ and $NH_3$.

According to the above-described manufacturing method of a semiconductor device, since plasma treatment using a plasma gas containing $NF_3$ and $NH_3$ is employed, production of a cavity in a crystalline semiconductor film can be suppressed.

A manufacturing method of a semiconductor device according to the invention comprises the steps of forming an amorphous film containing silicon over a substrate having an insulating surface, adding a metal element for promoting crystallization of an amorphous film over the amorphous film, applying heat treatment to the amorphous film to crystallize the amorphous film, thereby forming a crystalline semiconductor film over the substrate, and removing a silicon oxide film which is formed on the surface of the crystalline semiconductor film due to the heat treatment by plasma treatment using a plasma gas containing $H_2$.

According to the above-described manufacturing method of a semiconductor device, since plasma treatment using a plasma gas containing $H_2$ is employed, production of a cavity in a crystalline semiconductor film can be suppressed.

In addition, in a manufacturing method of a semiconductor device according to the invention, after removal of the silicon oxide film by the plasma treatment, laser light or strong light is preferably irradiated to the crystalline semiconductor film. It enables to reduce crystal defects of the crystalline semiconductor film.

A manufacturing method of a semiconductor device according to the invention comprises the steps of forming an amorphous film containing silicon over a substrate having an insulating surface, adding a metal element for promoting crystallization of an amorphous film over the amorphous film, applying heat treatment to the amorphous film to crystallize the amorphous film, thereby forming a crystalline semiconductor film over the substrate, and removing a silicon oxide film which on the surface of the crystalline semiconductor film due to the heat treatment by a gas containing a hydrogen atom.

According to the above-described manufacturing method of a semiconductor device, since a gas containing a hydrogen atom is employed, production of a cavity in a crystalline semiconductor film can be suppressed.

In addition, in a manufacturing method of a semiconductor device according to the invention, after removal of the silicon oxide film by the gas, laser light or strong light is preferably irradiated to the crystalline semiconductor film. It enables to reduce crystal defects of the crystalline semiconductor film.

Additionally, in a manufacturing method of a semiconductor device according to the invention, after irradiation of the laser light or the strong light, it is possible to form a gate insulating film so as to contact with the crystalline semiconductor film, form a gate electrode on the gate insulating film, and form source and drain regions in the crystalline semiconductor film. Since a TFT is formed by using such crystalline semiconductor film with production of a cavity suppressed, a defect of a withstand voltage can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by a solution containing organic solvent and fluoride so that production of a cavity in the crystalline semiconductor film can be suppressed.

According to the above-described semiconductor device, since production of a cavity in a crystalline semiconductor film can be suppressed, such crystalline semiconductor film contributes to suppress production of a defect of a withstand voltage in a TFT or a capacitor. Note that a crystalline semiconductor film in which production of a cavity is suppressed means that a cavity density is $1.0 \times 10^{-4}$ psc/$\mu m^2$ or less in the case of employing IPA as the organic solvent. The crystalline semiconductor film in which production of a cavity is suppressed is suppressed means that the number of cavities in each inspection by a scanning electron microscope is 0 psc in the case of employing IPA as the organic solvent. The crystalline semiconductor film in which production of a cavity is suppressed is suppressed also means that the number of cavities in an area of 1000 $\mu m^2$ inspected by the scanning electron microscope is 0 in the case of employing IPA as the organic solvent.

A semiconductor device according to the invention comprises a substrate having an insulating surface and a crystalline semiconductor film containing silicon formed over the substrate, in which a silicon oxide film formed on the surface of the crystalline semiconductor film is removed by a solution containing surfactant and fluoride so that production of a cavity in the crystalline semiconductor film can be suppressed. Note that a crystalline semiconductor film in which production of a cavity is suppressed means that a cavity density is $1.0 \times 10^{-4}$ psc/$\mu m^2$ or less in the case of employing surfactant as the organic solvent. The crystalline semiconductor film in which production of a cavity is suppressed means that the number of cavities in each inspection by a scanning electron microscope is 0 psc in the case of employing surfactant as the organic solvent. The crystalline semiconductor film in which production of a cavity is suppressed also means that the number of cavities in an area of 1000 $\mu m^2$ inspected by the scanning electron microscope is 0 psc n the case of employing surfactant as the organic solvent.

A semiconductor device according to the invention comprises a substrate having an insulating surface and a crystalline semiconductor film containing silicon formed over the substrate, in which a silicon oxide film formed on the surface of the crystalline semiconductor film is removed by dry etching so that production of a cavity in the crystalline semiconductor film can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by using a plasma gas containing $CHF_3$ so that production of a cavity in the crystalline semiconductor film can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by using a plasma gas containing at least one of Ar, $H_2$ and $NH_3$, and $CHF_3$ so that production of a cavity in the crystalline semiconductor film can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by using a plasma gas containing $NF_3$ so that production of a cavity in the crystalline semiconductor film can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by using a plasma gas containing $NF_3$ and $NH_3$ so that production of a cavity in the crystalline semiconductor film can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by using a plasma gas containing $H_2$ so that production of a cavity in the crystalline semiconductor film can be suppressed.

A semiconductor device according to the invention comprises a substrate having an insulating surface and a crystalline semiconductor film containing silicon formed over the substrate, in which a silicon oxide film formed on the surface of the crystalline semiconductor film is removed by using a gas containing a hydrogen atom so that production of a cavity in the crystalline semiconductor film can be suppressed.

According to the above-described semiconductor devices, production of a cavity whose bottom portion reaches a base insulating film can be reduced in a crystalline semiconductor film.

Additionally, in a semiconductor device according to the invention, it is possible to form a gate insulating film so as to contact with the crystalline semiconductor film, form a gate electrode on the gate insulating film, and form source and drain regions in the crystalline semiconductor film. Since a TFT is formed by using such crystalline semiconductor film with production of a cavity suppressed, a defect of a withstand voltage can be suppressed.

According to the invention, as described hereinbefore, a method of removing a silicon oxide film formed on the surface of a crystalline semiconductor film due to heat treatment by a solution containing organic solvent and fluoride or the like is adopted. Accordingly, a semiconductor device in which production of a cavity in a crystalline semiconductor film can be suppressed and a manufacturing method thereof can be provided.

DETAILED DESCRIPTION OF THE INVENTION

Hereinafter, embodiment modes of the invention are described with reference to the accompanying drawings.

Embodiment Mode 1

FIGS. 1A to 3D are cross-sectional views showing a manufacturing method of a semiconductor device according to Embodiment Mode 1 of the invention. A CMOS thin film transistor is cited as an example of the semiconductor device here.

Figure 1A:
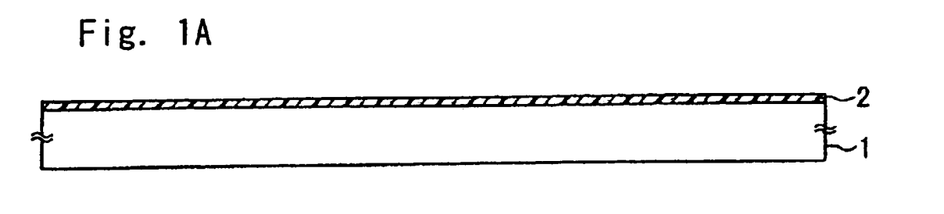
FIGS. 1A to 1E are cross-sectional views showing a manufacturing method of a semiconductor device according to Embodiment Mode 1.

First, as illustrated in FIG. 1A, a base film is formed on a substrate 1, followed by a base insulating film 2 formed to have a thickness of approximately 100 nm.

The base insulating film 2 serves to prevent impurity diffusion from the substrate 1 to a semiconductor layer. A light transmissive substrate such as glass or quartz is employed for the substrate 1. In this embodiment mode, low alkali glass is employed for the substrate 1 and a silicon oxynitride film having a thickness of 100 nm formed by plasma CVD (chemical vapor deposition) is employed for the base insulating film 2.

Note that in this embodiment mode, although the base insulating film 2 has a single layer structure, a laminated structure of two or more layers may be adopted as long as it has an effect of prevention of impurity diffusion.

Figure 1B:
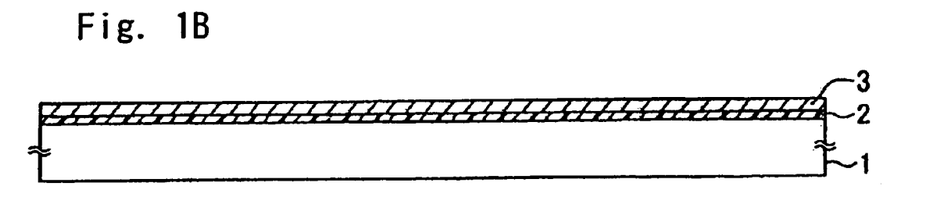

Subsequently, as illustrated in FIG. 1B, an amorphous silicon film 3 having a thickness of 30 to 60 nm is formed on the base insulating film 2. In this embodiment mode, an amorphous silicon film 3 having a thickness of 55 nm formed by plasma CVD is employed.

Figure 1C:
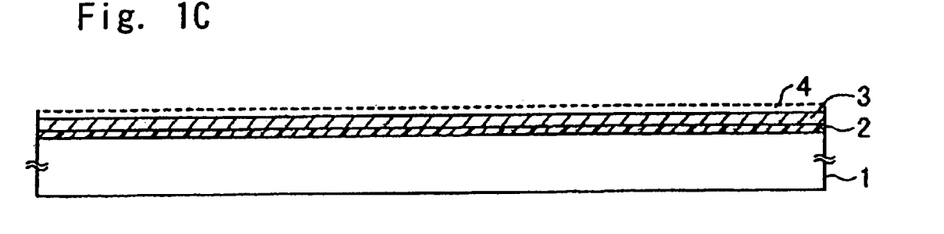

Then, as illustrated in FIG. 1C, a solution 4 containing a catalyst metal element for promoting crystallization is added onto the surface of the amorphous silicon film 3, and heat treatment is applied to crystallize the amorphous silicon film 3. Consequently, a crystalline silicon film 5 is formed on the base insulating film 2 as illustrated in FIG. 1D.

As the catalyst metal element, one or more of nickel (Ni), ferrum (Fe), cobalt (Co), ruthenium (Ru), palladium (Pa), osmium (Os), iridium (Ir), platinum (Pt), copper (Cu), and aurum (Au) is preferably employed. In this embodiment mode, a catalyst metal element is added by coating the surface of the amorphous silicon film 3 with a solution containing Ni.

As for the heat treatment, heat treatment is applied at 400 to 500° C. for 1 hour to eliminate hydrogen in the amorphous silicon film 3 firstly, and then heat treatment is applied using a furnace at 500 to 600° C. (preferably at 550 to 570° C.) for 0.5 to 12 hours (preferably for 4 to 6 hours). Heat treatment using an RTA (Rapid Thermal Annealing) and the like may be performed as well. In this embodiment mode, heat treatment is applied at 500° C. for 1 hour, and subsequently heat treatment is applied using a furnace is applied at 550° C. for 4 hours so that the amorphous silicon film 3 is crystallized to form the crystalline silicon film 5.

Figure 1D:
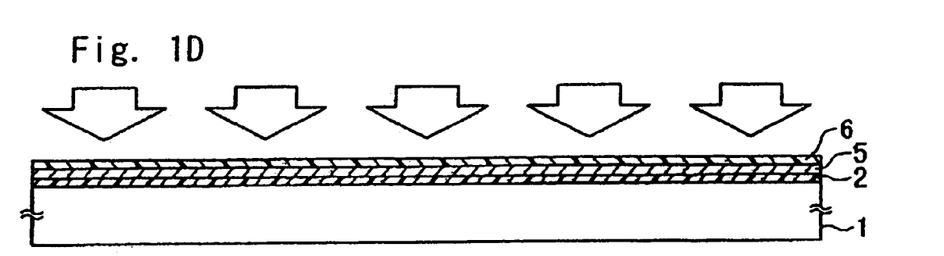

When the crystalline silicon film 5 is formed through the heat treatment, a silicon oxide film 6 is formed on the surface of the crystalline silicon film 5 as illustrated in FIG. 1D. Therefore, the crystalline silicon film 5 is immersed in a solution containing organic solvent and fluoride to eliminate the silicon oxide film 6 on the surface of the crystalline silicon film 5.

In the case where such solution containing organic solvent and fluoride is used, nickel silicide, which may be separated out in the crystalline silicon film 5, is difficult to etch. Consequently, production of a cavity whose bottom portion reaches the base insulating film 2 can be suppressed in the crystalline silicon film 5.

Note that the organic solvent is preferably any one of IPA (isopropyl alcohol), ethanol, denatured alcohol, and ethylene glycol. Denatured alcohol is inexpensive because of free liquor tax.

Figure 1E:
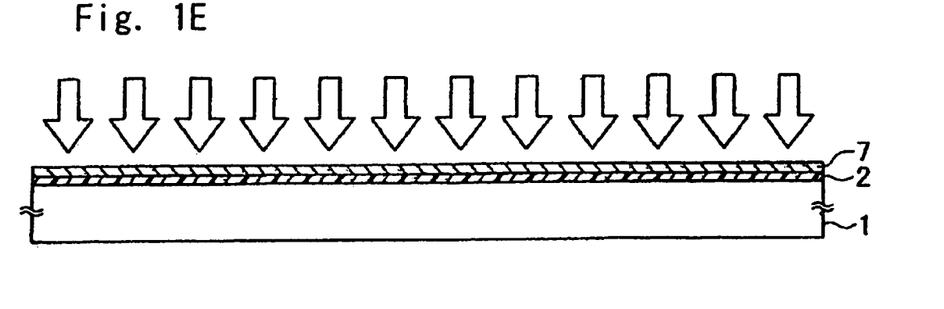

Then, as illustrated in FIG. 1E, laser light (e.g., excimer laser light) or strong light is irradiated to the crystalline silicon film 5. Consequently, a high-quality crystalline silicon film 7 with few crystal defects can be obtained. In addition, a shallow cavity in the crystalline silicon film 5 can be eliminated by the irradiation of laser light. Production of a cavity can be suppressed in a crystalline semiconductor film in this manner.

In this embodiment mode, a solution containing organic solvent and fluoride is used to eliminate a silicon oxide film on the surface of a crystalline silicon film in order to suppress production of a cavity in the crystalline silicon film. However, the method of suppressing production of a cavity may be modified to the following manner.

Modified Mode 1 is described below. The crystalline silicon film 5 after being crystallized is immersed in a solution containing surfactant and fluoride (e.g., BHF; $NH_4F$, HF, and $H_2O$ mixed at an arbitrary rate) to eliminate the silicon oxide film 6 formed in the heat treatment for crystallization from the surface of the crystalline silicon film 5. In the case where such solution containing surfactant and fluoride is used, nickel silicide, which may be separated out in the crystalline silicon film 5, is difficult to etch. Consequently, production of a cavity whose bottom portion reaches the base insulating film 2 can be suppressed in the crystalline silicon film 5, resulting in suppression of production of a cavity in a crystalline silicon film. Note that the surfactant preferably contains at least one of alkyl sulfonic acid, ω-hydrofluoro-alkyl-carboxylic acid, aliphatic carboxylic acid, aliphatic amine, aliphatic alcohol, and aliphatic carboxylic acid chloride.

The surfactant serves as follows: in the case where hydrophobic Si is exposed after an oxide film being etched, a hydrophobic group of the surfactant adheres to the Si while a hydrophilic group thereof is aligned in the solution.

Then, laser light (e.g., excimer laser light) or strong light is irradiated to the crystalline silicon film 5 and the surface of the crystalline silicon film is inspected by an electron microscope. Photographs thereof are shown in FIGS. 5A to 5F. As is evident from these photographs, it is certain that production of a cavity can be suppressed in a crystalline silicon film according to this modified mode.

Figure 7:
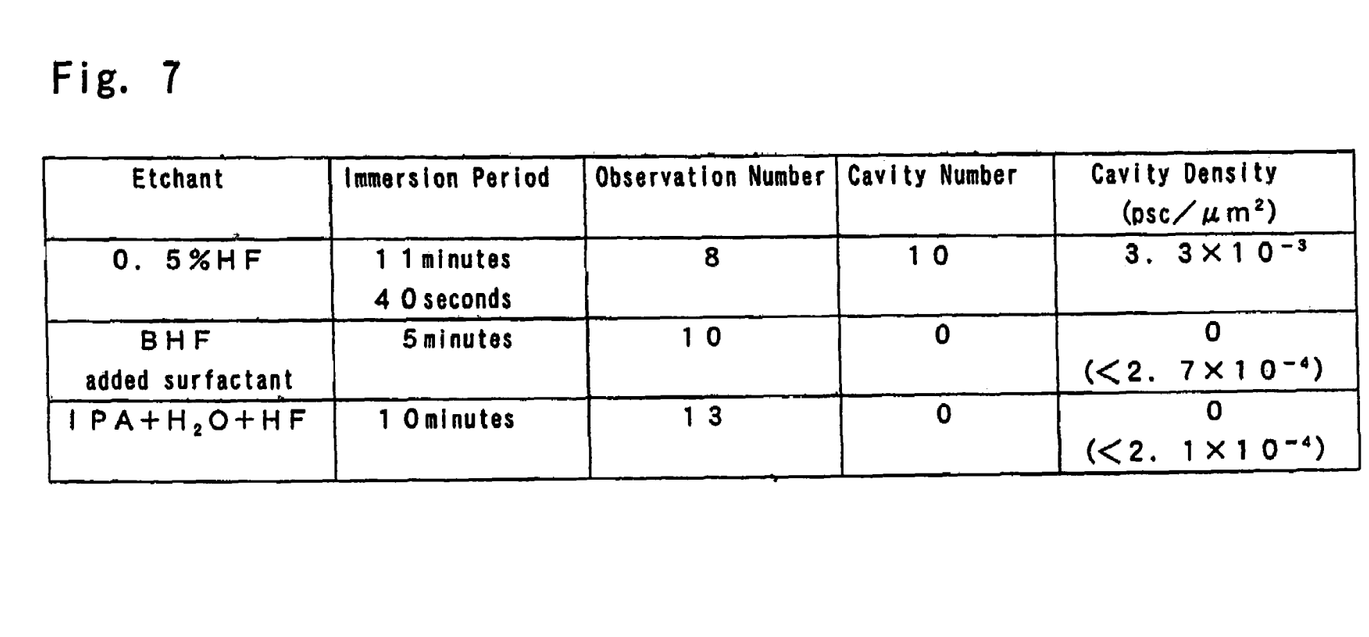
FIG. 7 shows a conventional manufacturing method of a semiconductor device, respective manufacturing methods according to Embodiment Mode 1 and Modified Mode 1, and experimental results thereof.

FIG. 7 shows a conventional manufacturing method of a semiconductor device, respective manufacturing methods according to Embodiment Mode 1 and Modified Mode 1, and experimental results thereof.

Conventional manufacturing method of a semiconductor device and a result thereof, shown in FIG. 7, are as follows: a crystalline silicon film is immersed in an etchant of HF at 0.5% for 11 minutes and 40 seconds to eliminate a silicon oxide film, and then the surface of the crystalline silicon film is inspected by a scanning electron microscope in an area of approximately 400 μm² at 8 times. The number of cavities and a cavity density thereof are 10 psc and $3.3 \times 10^{-3}$ psc/μm² respectively.

A manufacturing method of a semiconductor device and a result thereof according to Modified Mode 1, shown in FIG. 7, are as follows: a crystalline silicon film is immersed in an etchant of a solution containing surfactant and BHF for 5 minutes to eliminate a silicon oxide film, and then the surface of the crystalline silicon film is inspected by a scanning electron microscope in an area of approximately 400 μm² at 10 times. The number of cavities and a cavity density thereof are 0 and 0 psc/μm² respectively.

A manufacturing method of a semiconductor device and a result thereof according to Embodiment Mode 1, shown in FIG. 7, are as follows: a crystalline silicon film is immersed in an etchant of a solution containing IPA, $H_2O$ and HF for 11 minutes to eliminate a silicon oxide film, and then the surface of the crystalline silicon film is inspected by a scanning electron microscope in an area of approximately 400 μm² at 13 times. The number of cavities and a cavity density thereof are 0 psc and 0 psc/μm² respectively. Note that an immersion period varies depending on an etchant as described above because an etching rate of each etchant to oxide silicon is different from each other, and each etching period is set here to be 10 times as long as a period required for eliminating oxide silicon. A cavity density of $1.0 \times 10^{-4}$ psc/μm² or less is acceptable, though 0 psc/μm² is more preferable.

It is evident from the results in FIG. 7 that Embodiment Mode 1 and Modified Mode 1 enable to suppress production of a cavity in a crystalline silicon film.

Next, Modified Mode 2 is described. The surface of the crystalline silicon film 5 after being crystallized is dry etched to eliminate the silicon oxide film 6 formed in the heat treatment for crystallization from the surface of the crystalline silicon film 5. In the case where such dry etching is used, production of a cavity in the crystalline silicon film 5 can be suppressed.

Modified Mode 3 is described subsequently. The silicon oxide film 6 formed in the heat treatment for crystallization is eliminated from the surface of the crystalline silicon film 5 by plasma treatment using a plasma gas containing $CHF_3$. In the case where such plasma treatment is used, nickel silicide, which may be separated out in the crystalline silicon film 5, is difficult to etch, resulting in suppression of production of a cavity in the crystalline silicon film 5.

The plasma treatment using a plasma gas containing $CHF_3$ is applied in accordance with the following condition: a processing time of 120 seconds, a power density of 0.2 W/cm², a pressure of 25 m Torr and a $CHF_3$ gas flow at a flow rate of 35 sccm.

Modified Mode 4 is described. The silicon oxide film 6 formed in the heat treatment for crystallization is eliminated from the surface of the crystalline silicon film 5 by plasma treatment using a plasma gas containing $CHF_3$, and then $CF_X$, that is deposited on the surface of the crystalline semiconductor film 5 in removal of the silicon oxide film 6 by the plasma treatment, is eliminated by plasma treatment using a plasma gas containing at least one of Ar, $H_2$ and $NH_3$. In the case where each of such plasma treatment is used, nickel silicide, which may be separated out in the crystalline silicon film 5, is difficult to etch, resulting in suppression of production of a cavity in the crystalline silicon film 5.

The plasma treatment using a plasma gas containing $CHF_3$ is applied in accordance with the following condition: a processing time of 120 seconds, a power density of 0.2 W/cm², a pressure of 25 m Torr and a $CHF_3$ gas flow at a flow rate of 35 sccm.

The plasma treatment using a plasma gas containing at least one of Ar, $H_2$ and $NH_3$ is applied in accordance with the following condition: a processing time of 120 seconds, a power density of 0.5 W/cm², a pressure of 50 m Torr and an Ar gas flow at a flow rate of 50 sccm.

Next, Modified Mode 5 is described. The silicon oxide film 6 formed in the heat treatment for crystallization is eliminated from the surface of the crystalline silicon film 5 by plasma treatment using a plasma gas containing at least one of Ar, $H_2$ and $NH_3$, and $CHF_3$. In the case where such plasma treatment is used, nickel silicide, which may be separated out in the crystalline silicon film 5, is difficult to etch, resulting in suppression of production of a cavity in the crystalline silicon film 5. In addition, deposition of $CF_X$ on the crystalline silicon film 5 during the plasma treatment can be suppressed.

The plasma treatment using a plasma gas containing at least one of Ar, $H_2$ and $NH_3$, and $CHF_3$ is applied in accordance with the following condition: a processing time of 120 seconds, a power density of 0.2 W/cm², a pressure of 25 m Torr and an Ar gas flow at a flow rate of 10 sccm.

Modified Mode 6 is described below. The silicon oxide film 6 formed in the heat treatment for crystallization is eliminated from the surface of the crystalline silicon film 5 by plasma treatment using a plasma gas containing $NF_3$. In the case where such plasma treatment is used, nickel silicide, which may be separated out in the crystalline silicon film 5, is difficult to etch, resulting in suppression of production of a cavity in the crystalline silicon film 5.

The plasma treatment using a plasma gas containing $NF_3$ is applied in accordance with the following condition: a processing time of 120 seconds, a power density of 0.2 W/cm², a pressure of 25 m Torr and an $NF_3$ gas flow at a flow rate of 35 sccm.

Modified Mode 7 is described. The silicon oxide film 6 formed in the heat treatment for crystallization is eliminated from the surface of the crystalline silicon film 5 by plasma treatment using a plasma gas containing $NF_3$ and $NH_3$. In the case where such plasma treatment is used, nickel silicide, which may be separated out in the crystalline silicon film 5, is difficult to etch, resulting in suppression of production of a cavity in the crystalline silicon film 5.

The plasma treatment using a plasma gas containing $NF_3$ and $NH_3$ is applied in accordance with the following condition: a processing time of 120 seconds, a power density of 0.2 W/cm², a pressure of 25 m Torr and an $NH_3$ gas flow at a flow rate of 25 sccm.

Next, Modified Mode 8 is described. The silicon oxide film 6 formed in the heat treatment for crystallization is eliminated from the surface of the crystalline silicon film 5 by plasma treatment using a plasma gas containing $H_2$. In the case where such plasma treatment is used, nickel silicide, which may be separated out in the crystalline silicon film 5, is difficult to etch, resulting in suppression of production of a cavity in the crystalline silicon film 5.

The plasma treatment using a plasma gas containing $H_2$ is applied in accordance with the following condition: a processing time of 120 seconds, a power density of 0.5 W/cm², a pressure of 25 m Torr and an $H_2$ gas flow at a flow rate of 50 sccm.

Modified Mode 9 is described below. The silicon oxide film 6 formed in the heat treatment for crystallization is eliminated from the surface of the crystalline silicon film 5 by a gas containing a hydrogen atom. In the case where such gas is used, nickel silicide, which may be separated out in the crystalline silicon film 5, is difficult to etch, resulting in suppression of production of a cavity in the crystalline silicon film 5.

Description of modified modes terminates now, and hereinafter, description is made back to Embodiment Mode 1. After laser light (e.g., excimer laser light) or strong light is irradiated to the crystalline silicon film 5 as aforedescribed, a channel doping is applied for controlling a threshold value of a TFT, by which boron of a p-type impurity of approximately $5 \times 10^{16}$ to $5 \times 10^{17}/cm^3$ is doped to the crystalline silicon film 7.

The threshold value of a TFT varies depending on various factors including properties of the crystalline silicon film 7 and a gate insulating film which is formed in a subsequent step. Thus, boron is not necessarily added, and alternatively, no impurity may be added or an n-type impurity such as phosphorous may be added if necessary. In addition, the amount of boron for doping is not limited to the above-described density and it can be determined arbitrarily.

Figure 2A:
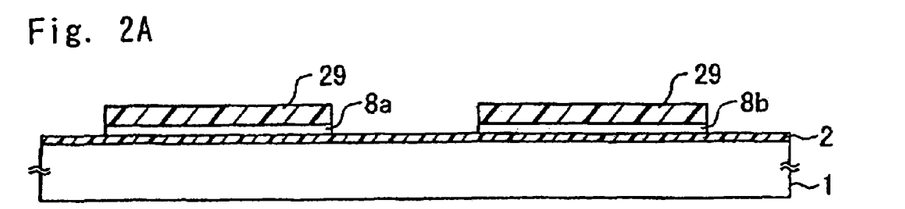
FIGS. 2A to 2E are cross-sectional views showing a manufacturing method of a semiconductor device according to Embodiment Mode 1.

Then, as illustrated in FIG. 2A, an element isolation of the crystalline silicon film 7 is applied by photo lithography and etching. That is, a photoresist film is coated on the crystalline silicon film 7 and the photoresist film is exposed and developed to form a resist pattern 29 on the crystalline silicon film 7.

Subsequently, the crystalline silicon film 7 is etched in accordance with the resist pattern 29 as a mask. Consequently, island-shaped semiconductor layers (active layers) 8a and 8b made of the crystalline silicon film 7 are formed on the base insulating film 2.

Figure 2B:
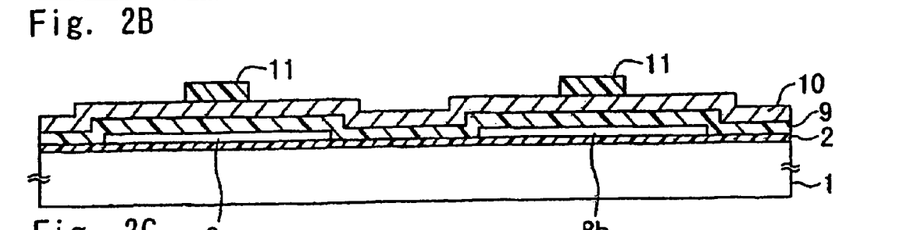

After removing the resist pattern 29, a gate insulating film 9 having a thickness of 40 to 130 nm is formed by plasma CVD on the semiconductor layers 8a and 8b and the base insulating film 2 as illustrated in FIG. 2B.

Then, a conductive film 10 having a thickness of 200 to 500 nm is formed on the gate insulating film 9. The conductive film 10 is a tungsten (W) film in this embodiment mode. Note that a material for forming a gate electrode is not limited to this, and an element selected among TaN, Ta, W, Ti, Mo, Al, Cu, Cr, and Nd, an alloy film or a compound material in which such elements are combined, or a semiconductor film typified by a polycrystalline silicon film added with an impurity element such as phosphorous may be employed alternatively.

After that, a photoresist film is coated on the conductive film 10 and the photoresist film is exposed and developed to form a resist pattern 11 on the conductive film 10.

Figure 2C:
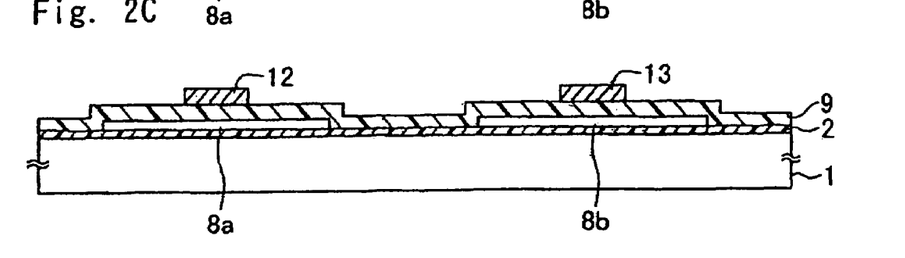

The conductive film 10 is dry etched in accordance with the resist pattern 11 as a mask. Consequently, the conductive film 10 is processed into arbitrarily-shaped gate electrodes 12 and 13 as illustrated in FIG. 2C. Then, the resist pattern 11 is removed. Any shape of a gate electrode other than the above may be adopted as well. Although the gate electrodes 12 and 13 have single layer structures in this embodiment mode, a laminated structure of two or more layers may be adopted for each of the gate electrode.

Figure 2D:
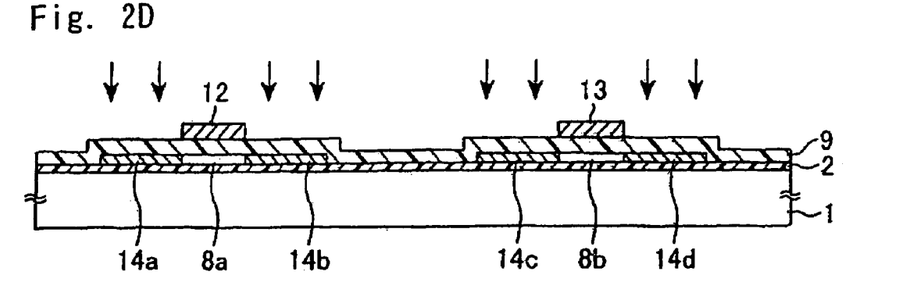

Subsequently, as illustrated in FIG. 2D, phosphorous of an n-type impurity element is doped into the semiconductor layers 8a and 8b by using the gate electrodes 12 and 13 as a mask. Accordingly, the phosphorous is injected into regions 14a and 14b, and 14c and 14d in the semiconductor layers 8a and 8b respectively.

Figure 2E:
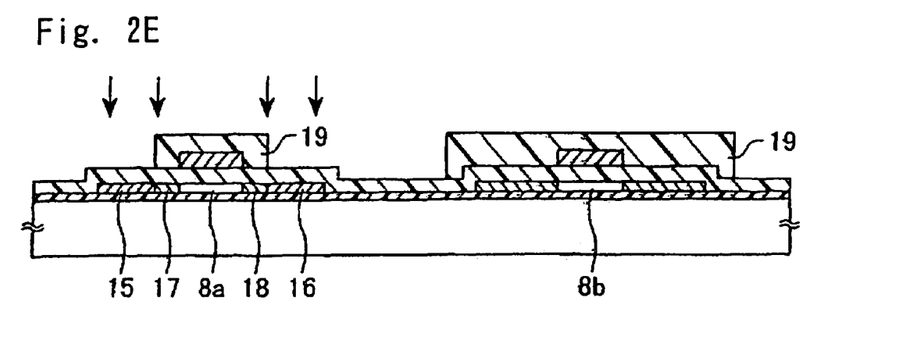

An n-type impurity element is added in order to form source and drain regions 15 and 16 of an n-channel TFT as illustrated in FIG. 2E. A resist pattern 19 is formed so as to cover a region for a p-channel TFT and low density impurity regions (LDD regions) 17 and 18 of the n-channel TFT so that a high density n-type impurity element is not added to a region for a source of the p-channel TFT.

Subsequently, phosphorous of an n-type impurity element is doped into the semiconductor layer 8a by using the resist pattern 19 as a mask. A series of doping of the n-type impurity element described above is performed to satisfy the following condition: n-type impurities are added to the LDD regions 17 and 18, and the source and drain regions 15 and 16 at a density of $1 \times 10^{16}$ to $1 \times 10^{18}$ atoms/cm$^3$ and a density of $1 \times 10^{19}$ to $1 \times 10^{21}$ atoms/cm$^3$ respectively.

Figure 3A:
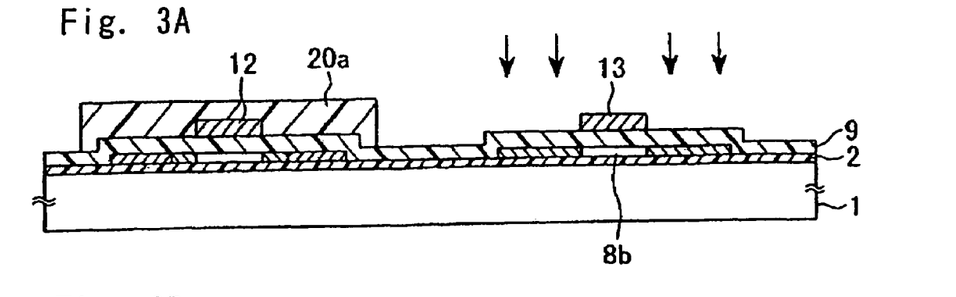
FIGS. 3A to 3D are cross-sectional views showing a manufacturing method of a semiconductor device according to Embodiment Mode 1.

After that, as illustrated in FIG. 3A, a resist pattern 20a is formed so as to cover the n-channel TFT and boron of a p-type impurity is doped into the semiconductor layer 8b of the p-channel TFT by using the resist pattern 20a and the gate electrode 13 as a mask.

Figure 3B:
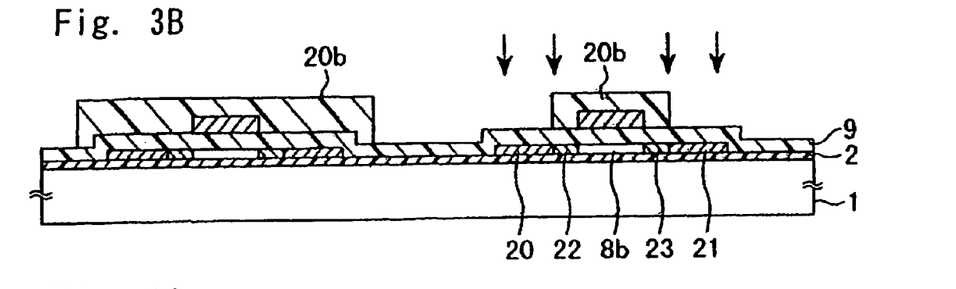
Figure 3C:
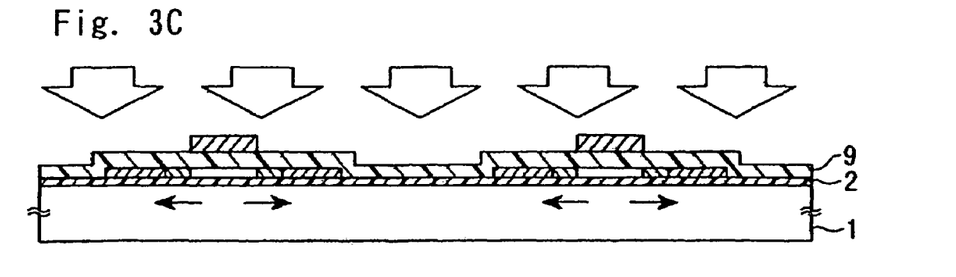

After removing the resist pattern 20a, a p-type impurity element is added in order to form source and drain regions 20 and 21 of the p-channel TFT as illustrated in FIG. 3B. A resist pattern 20b is formed so as to cover a region for the n-channel TFT and low density impurity regions (LDD regions) 22 and 23 of the p-channel TFT so that a high density p-type impurity element is not added to the n-channel TFT.

Subsequently, boron of a p-type impurity element is doped into the semiconductor layer 8b by using the resist pattern 20b as a mask. A series of doping of the p-type impurity element described above is applied to satisfy the following condition: in the LDD regions 22 and 23, and the source and drain regions 20 and 21, a density of boron is higher than the density of phosphorous, that are $3 \times 10^{17}$ to $4 \times 10^{18}$ atoms/cm$^3$ and $3 \times 10^{19}$ to $1 \times 10^{21}$ atoms/cm$^3$ respectively.

Then, the resist pattern 20b is removed and laser annealing is applied to activate the added impurities and restore crystallinity of the island-shaped silicon regions 8a and 8b which are damaged due to the doping step.

In this embodiment mode, phosphorous is injected into each of the source and drain regions 15 and 16 of the n-channel TFT and the source and drain regions 20 and 21 of the p-channel TFT at a density of $1 \times 10^{19}$ to $1 \times 10^{21}$ atoms/cm$^3$ whereas it is injected into each of the LDD regions 17 and 18 of the n-channel TFT and the LDD regions 22 and 23 of the p-channel TFT at a density of $1 \times 10^{16}$ to $1 \times 10^{18}$ atoms/cm$^3$. When laser is irradiated, a nickel gettering is carried out efficiently by the phosphorous.

As for the laser light, in the case of KrF excimer laser light (a wavelength of 248 nm), the laser light is preferably irradiated in accordance with a condition of an energy density of 200 to 400 mJ/cm$^2$ (e.g., 250 mJ/cm$^2$). In addition, the laser light is preferably irradiated for 2 to 20 shots per point. The substrate temperature in laser irradiation is set at 200° C.

After the laser annealing, thermal annealing is applied for 2 hours at 350° C. under a nitrogen atmosphere. Although the laser annealing and the thermal annealing are both applied in this embodiment mode, only one of them may be applied.

Figure 3D:
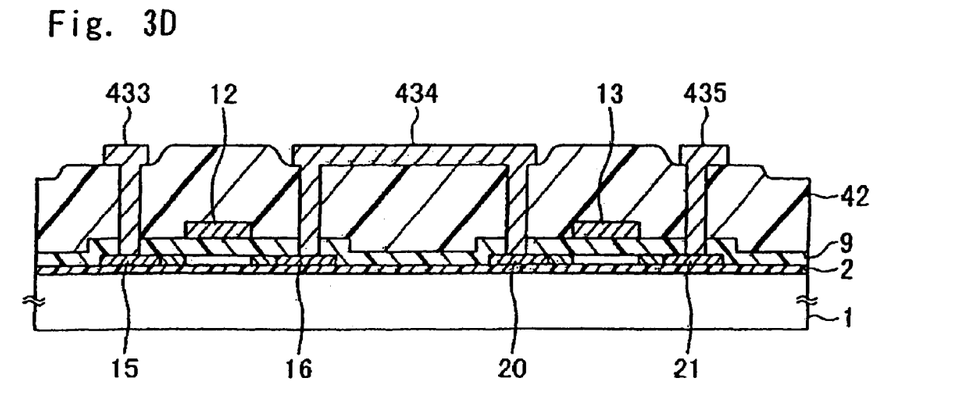

Subsequently, as illustrated in FIG. 3D, an interlayer insulating film 42 which is made of a silicon oxide film is formed on the whole surface including the gate electrodes 12 and 13 and the gate insulating film 9 by plasma CVD.

Contact holes are formed in the interlayer insulating film 42 and the gate insulating film 9 at corresponding positions to the source and drain regions 15, 16, 20, and 21 respectively.

Then, a multiple layer film of, for example, titanium and aluminum is formed in the contact holes and over the interlayer insulating film 42. The multiple layer film is patterned to form source and drain electrodes and a wiring 433, 434, and 435 in the contact holes and over the interlayer insulating film 42. Subsequently, heat treatment is applied for 2 hours under a hydrogen atmosphere at 350° C. The steps described hereinbefore complete a CMOS thin film transistor.

According to Embodiment Mode 1, since the silicon oxide film 6 is formed on the surface of the crystalline silicon film 5 when forming the crystalline silicon film 5 by heat treatment, the crystalline silicon film 5 is immersed in a solution containing organic solvent and fluoride to eliminate the silicon oxide film 6 on the surface of the crystalline silicon film 5. In the case where such solution containing organic solvent and fluoride is used, nickel silicide which may be separated out in the crystalline silicon film 5 is difficult to etch. Consequently, production of a cavity whose bottom portion reaches the base insulating film 2 can be suppressed in the crystalline silicon film 5. In addition, laser light or strong light is irradiated to the crystalline silicon film 5 to eliminate a shallow cavity in the crystalline silicon film 5. Production of a cavity can be suppressed in a crystalline semiconductor film in this manner. Such crystalline semiconductor film enables to suppress production of a defect of a withstand voltage in a TFT or a capacitor.

Embodiment Mode 2

Figure 4:
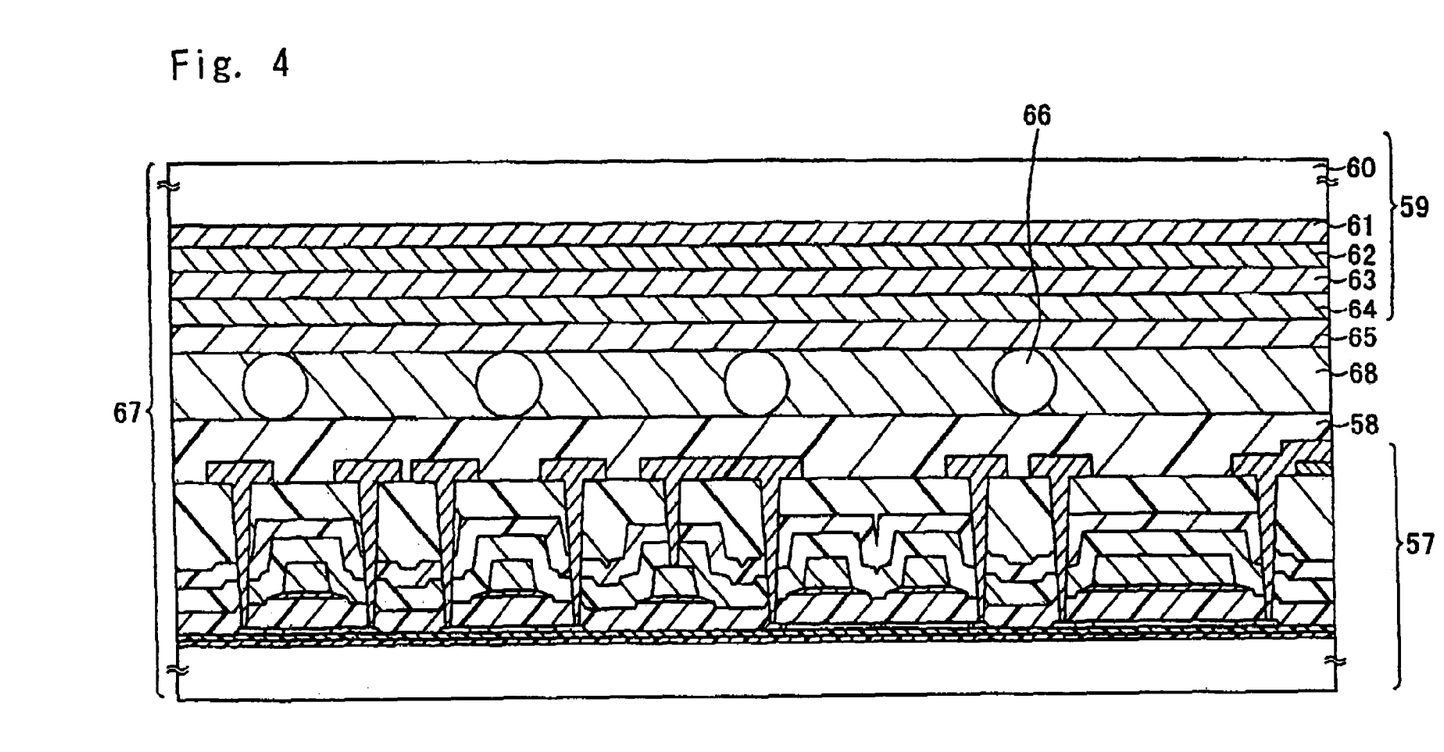
FIG. 4 is a cross-sectional view of a liquid crystal panel according to Embodiment Mode 2.
Figure 5A:
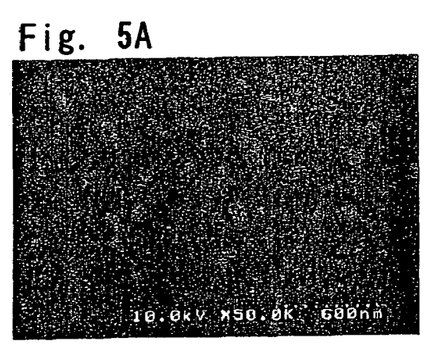
FIGS. 5A to 5F show photographs of the surface of a crystalline silicon film of Modified Mode 1, which are taken by an electron microscope.
Figure 5B:
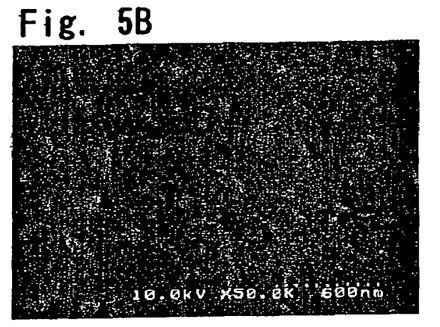
Figure 5C:
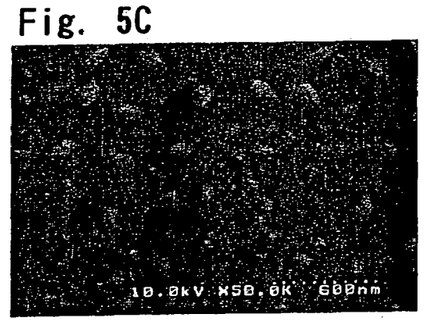
Figure 5D:
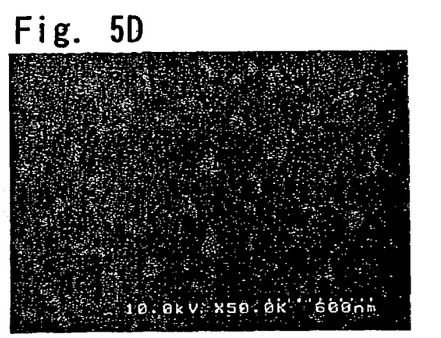
Figure 5E:
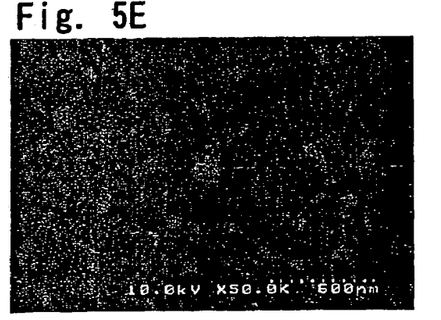
Figure 5F:
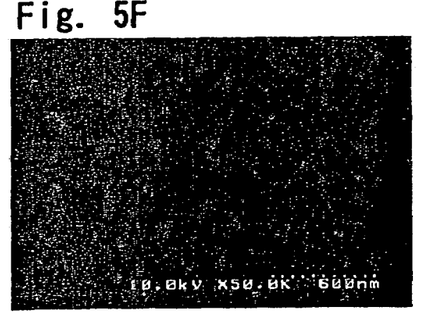
Figure 6A:
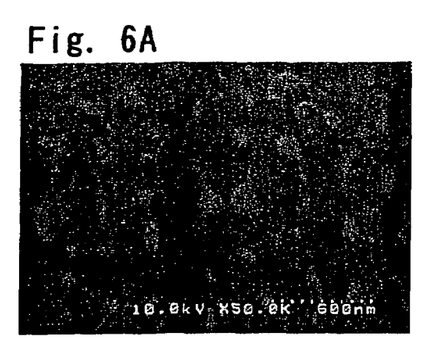
FIGS. 6A to 6F show photographs of the surface of a conventional crystalline silicon film, which are taken by an electron microscope.
Figure 6B:
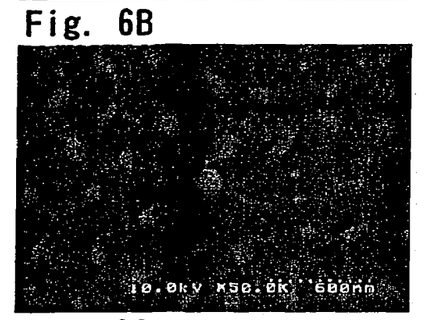
Figure 6C:
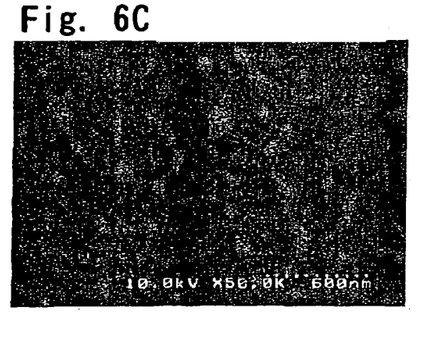
Figure 6D:
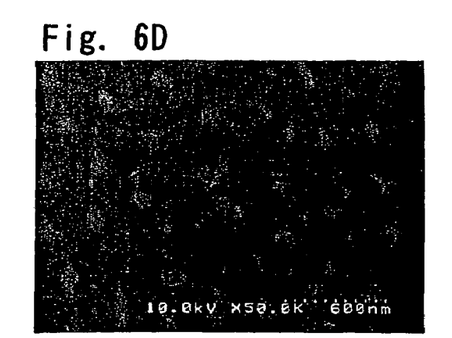
Figure 6E:
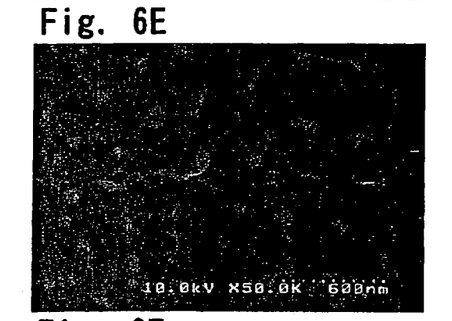
Figure 6F:
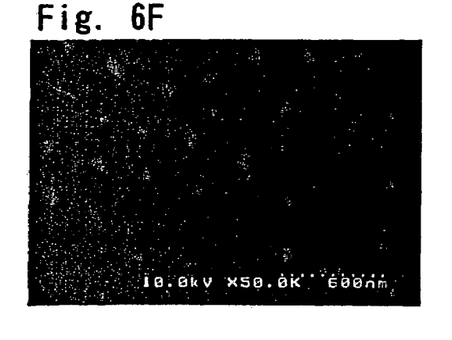

FIG. 4 is a cross-sectional view of a liquid crystal panel according to Embodiment Mode 2 of the invention. This liquid crystal panel is manufactured by the manufacturing method of a semiconductor device according to Embodiment Mode 1.

After a TFT array substrate 57 is formed in accordance with the manufacturing method of a semiconductor device according to Embodiment Mode 1, an alignment film 58 is formed in the TFT side of the TFT array substrate 57 and rubbing treatment is applied. The alignment film 58 comprises a polyimide resin or a polyamic-based resin.

A manufacturing method of an opposing substrate 59 is described below. A light shielding film 61 which is made of metal chromium is formed on a substrate 60. Then, a color filter 62 having three colors of red, blue, and green is provided on the light shielding film 61 arbitrarily. In the case where the color filter 62 is provided, a passivation film 63 which comprises an acrylic resin and the like is formed on the color filter 62 in order to embed and flatten steps between the color filter 62 and the light shielding film 61. An ITO film that is a transparent conductive film is formed on the passivation film 63, which is subsequently processed into a desired shape to form a pixel electrode 64 on the passivation film 63.

An alignment film 65 is formed on the pixel side of the opposing substrate 59 manufactured as above described and rubbing treatment is applied thereto. For adhesion between the opposing substrate 59 and the TFT array substrate 57, a sealing material (not shown) is applied to the opposing substrate 59 and the sealing material is harden temporarily by heat. After temporary hardening, spacers 66 each of a plastic ball are arranged in place in the alignment film 65 side of the opposing substrate 59.

Then, the TFT array substrate 57 and the opposing substrate 59 are attached to each other with high accuracy so as to sandwich the respective alignment films 58 and 65. An unnecessary portion of the attached substrates is cut off to obtain a liquid crystal panel 67 of a desired size. The liquid crystal panel 67 is filled with a liquid crystal member 68, and then the liquid crystal panel 67 is sealed completely by a sealing material.

Embodiment Mode 2 described above yields the identical effect to that of Embodiment Mode 1.

Note that although the invention has been fully described by way of Embodiment Modes, it is to be understood that various changes and modifications will be possible. Therefore, unless such changes and modifications depart from the scope of the invention, they can be implemented as well.

This application is based on Japanese Patent Application serial no. 2003-429552 filed in Japan Patent Office on 25 Dec. 2003, the contents of which are hereby incorporated by reference.

What is claimed is:

1. A manufacturing method of a semiconductor device, comprising the steps of:
    forming an amorphous film containing silicon over a substrate having an insulating surface;
    adding a metal element for promoting crystallization of the amorphous film onto the amorphous film;
    applying heat treatment to the amorphous film to crystallize the amorphous film, thereby a crystalline semiconductor film is formed over the substrate; and
    removing a silicon oxide film formed on a surface of the crystalline semiconductor film due to the heat treatment by plasma treatment using a plasma gas containing $NF_3$, thereby suppressing a production of a cavity in the crystallized film.

2. A manufacturing method of a semiconductor device, comprising the steps of:
    forming an amorphous film containing silicon over a substrate having an insulating surface;
    adding a metal element for promoting crystallization of the amorphous film onto the amorphous film;
    applying heat treatment to the amorphous film to crystallize the amorphous film, thereby a crystalline semiconductor film is formed over the substrate; and
    removing a silicon oxide film formed on a surface of the crystalline semiconductor film due to the heat treatment by plasma treatment using a plasma gas containing $NF_3$ and $NH_3$, thereby suppressing a production of a cavity in the crystallized film.

3. A manufacturing method of a semiconductor device according to claim 1, comprising the step of irradiating laser light or strong light to the crystalline semiconductor film following removal by the gas.

4. A manufacturing method of a semiconductor device according to claim 2, comprising the step of irradiating laser light or strong light to the crystalline semiconductor film following removal by the gas.

* * * * *